United States Patent
Cotte et al.

(10) Patent No.: US 6,875,286 B2
(45) Date of Patent: Apr. 5, 2005

(54) SOLID $CO_2$ CLEANING

(75) Inventors: John M. Cotte, New Fairfield, CT (US); Catherine Ivers, Hopewell Junction, NY (US); Kenneth J. McCullough, Fishkill, NY (US); Wayne M. Moreau, Wappingers Falls, NY (US); Robert J. Purtell, Mohegan Lake, NY (US); John P. Simons, Wappingers Falls, NY (US); William A. Syverson, Colchester, VT (US); Charles J. Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/320,836

(22) Filed: Dec. 16, 2002

(65) Prior Publication Data

US 2004/0112406 A1 Jun. 17, 2004

(51) Int. Cl.[7] .................................................. B08B 7/00
(52) U.S. Cl. ................................ 134/7; 134/6; 134/18; 134/21; 134/37; 134/902
(58) Field of Search ........................... 134/6, 7, 18, 21, 134/37, 902

(56) References Cited

U.S. PATENT DOCUMENTS

| | | | |
|---|---|---|---|
| 5,013,366 A | * | 5/1991 | Jackson et al. ................. 134/1 |
| 5,399,234 A | | 3/1995 | Yu et al. |
| 5,478,436 A | | 12/1995 | Winebarger et al. |
| 5,494,526 A | | 2/1996 | Paranjpe |
| 5,961,732 A | | 10/1999 | Patrin et al. |
| 5,976,264 A | | 11/1999 | McCullough et al. |
| 6,066,032 A | | 5/2000 | Borden et al. |
| 6,135,864 A | | 10/2000 | Kenny et al. |
| 6,174,225 B1 | | 1/2001 | Becker |
| 6,200,393 B1 | | 3/2001 | Romack et al. |
| 6,228,826 B1 | | 5/2001 | DeYoung et al. |
| 6,242,165 B1 | | 6/2001 | Vaartstra |
| 6,277,753 B1 | | 8/2001 | Mullee et al. |
| 6,306,564 B1 | | 10/2001 | Mullee |
| 6,331,487 B2 | | 12/2001 | Koch |
| 6,439,247 B1 | | 8/2002 | Kittle |
| 6,451,375 B1 | | 9/2002 | Cotte et al. |

* cited by examiner

*Primary Examiner*—Zeinab El-Arini
(74) *Attorney, Agent, or Firm*—Delio & Peterson, LLC; John J. Tomaszewski; Lisa U. Jaklitsch

(57) ABSTRACT

A method and apparatus are provided for removing solid and/or liquid residues from electronic components such as semiconductor wafers utilizing liquid or supercritical carbon dioxide which is solidified on the surface of the wafer and then vaporized and removed from the system. In a preferred embodiment the solidification and vaporizing steps are repeated (cycled) before removal of the $CO_2$ from the vessel. The residues are carried away with the vaporized carbon dioxide.

10 Claims, 1 Drawing Sheet

SOLID CO$_2$ CLEANING

BACKGROUND OF THE INVENTION

1. Field of the Invention

The present invention relates to the field of removing residues from a substrate surface and, in particular, to removing residue material from electronic component substrates such as integrated circuits and semiconductor wafers.

2. Description of Related Art

Integrated circuits are formed from semiconductor substrates within and upon whose surfaces are formed resistors, transistors, diodes, wires, vias and other electrical circuit elements. The electrical circuit elements are connected internally and externally to the semiconductor substrate upon which they are formed through patterned conductor layers which are separated by dielectric layers. It is common in the art of integrated circuit fabrication to form vias and other apertures through the dielectric layers such that conductive connections may be made between the patterned conductor layers and the electrical circuit elements which are separated by the dielectric layers. Vias and other apertures within and/or through dielectric layers within integrated circuits may be formed through photolithographic methods followed by etch methods including but not limited to wet chemical etch methods, Reactive Ion Etch (RIE) and dry plasma etch methods.

The removal of various layers is usually accomplished through use of liquid or gaseous etchants. In cases where the reaction products are fluids, these are readily removed from the reaction site so that etching can proceed at a uniform rate. In certain cases, however, the reaction products are insoluble solids that are, at best, difficult to remove. Such etchants serve only to undermine, or weaken, the layer's integrity near the surface and, in the absence of any other action, are thus quite ineffective as etchants.

In many etching processes, mechanical assistance in the form of a slurry comprising an abrasive powder suspended in a suitable liquid medium (such as the etchant itself) can be used to complement the action of the chemical etchant. This technique for removing material through a combination of chemical and mechanical means is referred to as Chemical Mechanical Polishing (CMP). CMP also makes possible the controlled removal of material along a planar etch front, unlike pure fluid etches where the etch front tends to follow the contours of the original surface. CMP is therefore widely used for the planarization of integrated circuits. A disadvantage of CMP is that at the completion of a CMP operation some of the slurry tends to be left behind on the freshly polished surface.

The use of Super Critical Fluid (SCF) CO$_2$ to clean or strip wafers is known. U.S. Pat. No. 5,976,264 is directed to stripping RIE residues from CF4 type etchants using SCF and a cryogenic aerosol wherein a relatively high pressure gas liquid mixture is allowed to rapidly expand into a region of lower pressure at cryogenic temperature, cooling the jet and causing the mixture to solidify. The use of Solid CO$_2$ pellets is also known but not practical for large wafer bombardment.

Bearing in mind the problems and deficiencies of the prior art, it is therefore an object of the present invention to provide a method for removing solid and/or liquid residues from substrate surfaces including electronic components such as integrated circuits and semiconductor wafers.

A further object of the invention is to provide an apparatus for removing solid and/or liquid residues from electronic components such as integrated circuits and semiconductors.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for removing solid and/or liquid residues from electronic component substrates such as a semiconductor wafer comprising the steps of:

supplying a pressure vessel;

supplying in the vessel a semiconductor substrate containing residues to be removed therefrom;

supplying carbon dioxide in the vessel at a pressure and temperature so that the carbon dioxide is a liquid or above the critical pressure and temperature so that the carbon dioxide is a supercritical fluid;

lowering the temperature of the substrate surface so that the carbon dioxide contacting the surface of the substrate is converted to the solid state on the substrate surface;

changing the temperature and/or pressure in the vessel so that the carbon dioxide in the vessel is converted to the liquid and/or gaseous state; removing the carbon dioxide from the vessel; and removing the semiconductor substrate from the vessel.

In another aspect of the invention an apparatus is provided for removing solid and/or liquid residues from electronic component substrates such as semiconductor wafers comprising:

a pressure vessel adapted to hold a semiconductor wafer therein;

means for supplying carbon dioxide to the pressure vessel;

means for adjusting the temperature and pressure in the pressure vessel so that the carbon dioxide is converted to the liquid state or supercritical state;

means for lowering the temperature of the substrate surface so that carbon dioxide in contact with the substrate surface is converted to the solid state on the semiconductor substrate surface;

means for adjusting the temperature and pressure in the pressure vessel so that the carbon dioxide is converted to the liquid and/or gaseous state; and means for removing the carbon dioxide from the pressure vessel;

wherein when the carbon dioxide is converted to the solid state on the substrate surface and then converted to the liquid and/or gaseous state, residues on the semiconductor substrate are removed.

In a further aspect of the invention, the lowering of the temperature of the substrate surface and the changing of the temperature and pressure in the vessel to convert the CO$_2$ to the liquid and/or gaseous state is repeated (cycled) before the CO$_2$ is removed from the vessel.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
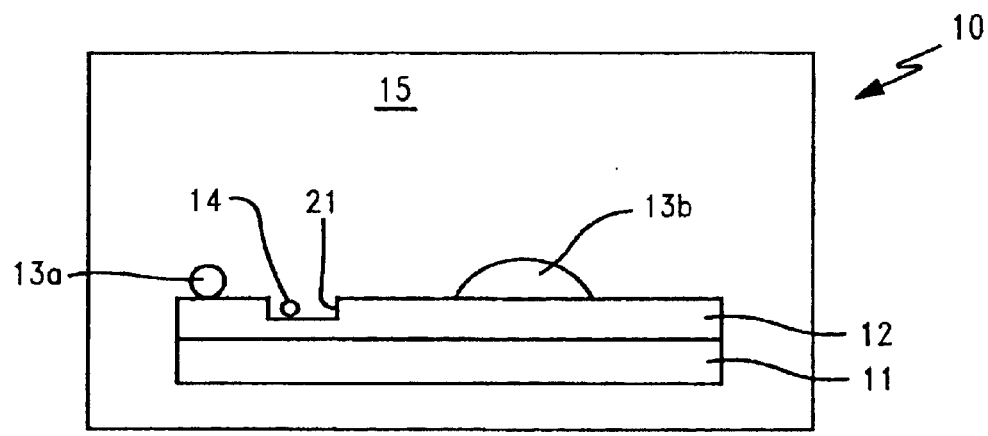
FIGS. 1A–1C are schematic illustrations of a high-pressure reactor having a wafer therein with residue on the surface which is treated according to a method and apparatus of the invention.

In describing the preferred embodiment of the present invention, reference will be made herein to FIGS. 1A–1C of the drawings in which like numerals refer to like features of the invention. Features of the invention are not necessarily shown to scale in the drawings.

The invention in one aspect is to remove residues from substrate surfaces and utilizes the solid/liquid/gas states of $CO_2$ to effectively remove solid or liquid residues from semiconductor surfaces that remain after completion of semiconductor processing steps such as a Reactive Ion Etch (RIE), dry plasma etch, and Chemical Mechanical Polishing (CMP) process steps.

The invention takes advantage of the difference in density of carbon dioxide in its various states. The density of dry ice (solid $CO_2$) is about 1.56. The density of liquid $CO_2$ at 0° C. is about 0.91 and at 31° C. is about 0.5 (less than 1000 psi). When $CO_2$ is frozen it contracts in volume based on the formula: Volume=Mass/Density by more than three (3) times (0.5 to 1.56). This is much higher than ice for example. It has been found that freezing of liquid or supercritical $CO_2$ is very effective for delamninating and/or removing particles especially since the liquid or SCF $CO_2$ penetrates into voids in the substrate which may contain residues. This invention preferably utilizes a thermoelectric/cooling stage in contact with the wafer to freeze $CO_2$ in contact with the wafer. The supercritical high-pressure reactor is typically capable of ranging, for example, from –180° C. to 100° C. and up to 10,000 psi. The physical properties of $CO_2$ at its various states is as follows:

| Physical State of $CO_2$ | Density |
|---|---|
| Solid | 1.56 at –80° C. and 1.62 at liq $N_2$ – 180° C. |
| Liquid | 0.9 at 0° C. and 0.5 at 31° C. |
| SCF | 0.3–0.9 > 31° C. and > 1200 psi |
| Gas | 0.09 at 0° C. and 0.3 at 30° C. converges at CP |

(1) Endpoint Detection.

If the wafer is cooled to –80° C. using, for example, a liquid nitrogen cold finger to condense solid $CO_2$ on the wafer surface, it must be related to a point above room temperature before it is exposed to air. It should also be purged with dry nitrogen during this process to reduce the exposure to atmospheric water. The wafer could be heated with ohmic or possible microwave or ultrasonic energy. Ohmic heating is considered to be the most effective.
(2) Return of Wafer to Atmospheric Conditions Without Condensing Particles or Water Vapor On It.

A cold finger as described above is preferred or cooling controlled wafer building stage. It is recommended that the highest grade of pressure vessel steel be used to prevent fracture during pressure and thermal cycles. Detecting the amount of solid $CO_2$ on the surface and stopping the cooling is important for safe operation of the apparatus. Such detection may be done optically or with a quartz crystal oscillator. The oscillator must be able to operate at cold temperatures and be able to detect the presence of solid on the surface by a frequency change.

The term "substrate" as used herein includes a material which has controlled features below the plane of the surface such as cavities, trenches or channels incorporated into the material and or raised features such as mesas. Cleaning of this type of surface must be selective to the residue and not modify the surface geometry (dimensions). Substrates include, but are not limited to, semiconductors, metals, polymers and insulators.

The term "supercritical fluid" is used herein to denote a material which is under conditions of not lower than a critical temperature, $T_e$, and not less than a critical pressure, $P_e$, in a pressure-temperature diagram of the intended compound. The preferred supercritical fluid employed in the present invention is $CO_2$ which may be used alone or in an admixture with another additive such as Ar, $NH_3$, $CH_4$, $CHF_3$, $C_2H_6$, n-$C_3H_8$, $H_2O$, $N_2O$ and the like. Surfactants such as those containing at least one $CF_x$ functional group may also be used in conjunction with the liquid or supercritical fluid.

The term supercritical fluid refers to the state of matter of a material above its critical point, i.e., a critical temperature, $T_e$, and critical pressure, $P_e$, at which two phases of a substance, in equilibrium with each other, become identical, forming one phase. Any supercritical fluid known to those skilled in the art such as $CO_2$ and/or Ar may be used in the present invention provided that they are capable of removing the residue from the semiconductor sample. The preferred liquid or supercritical fluid is $CO_2$. Other materials include Ar, $N_2O$, $NH_3$, $CO_2H_4$, $CHF_3$, $C_2H_6$, $H_2O$, n-$C_3H_8$, and the like.

Any grade of material can be employed in the present invention. If a low grade of material is employed which contains an unacceptable level of impurities therein, the material can be first purified to remove the impurities using techniques well known to those skilled in he art. For instance, a low-grade material could be purified by passing it through a column prior to entering the processing chamber.

The material can also be combined with additives or surfactants which would aid in removing residues from the semiconductor. Suitable additives include, but are not limited to, those mentioned hereinabove. Of these additives, $H_2O$ is most particularly preferred.

Typically, in the present invention, a material to be converted to a supercritical fluid is pre-pressurized to a pressure of about 1070 psi to 6000 psi. More preferably, the supercritical fluid is pre-pressurized to a pressure of about 3000 psi before entering the processing chamber. The pre-pressurized supercritical fluid is then transferred to the processing chamber which contains a semiconductor to be cleaned.

The semiconductors that can be employed in the present invention are any semiconductors that are processed by RIE or any of the other etching techniques mentioned hereinabove. Illustrated examples of suitable semiconductors that may be used in the present invention include, but are not limited to, semiconductor wafers, semiconductor chips, ceramic substrates, patterned film structures and the like.

The pressure within the process chamber during residue removal is typically from about 1070 psi to about 6000 psi. More preferably, the pressure within the process chamber during residue removal is about 3000 psi.

The temperature within the processing chamber during the residue removal is above 31° C. and generally from about 40° C. to about 80° C. More preferably, the temperature within the process chamber during residue removal is about 40° C.

To ensure effective removal of the residue from the semiconductor, the semiconductor should be exposed to the liquid or supercritical fluid under the above conditions for about 2 minutes to 30 minutes or more, typically about 4–6 minutes, e.g., 5 minutes.

The material exiting the process chamber may be cleaned and recycled into the apparatus so as to form a closed reactor system. Such a closed reactor system would generally reduce the processing cost in producing clean semiconductors.

Referring now to FIG. 1A, a high-pressure reactor is shown generally as numeral 10. A wafer 12 is positioned on a cooling/heat module 11. The module 11 is adapted to heat or cool the wafer 12 as described hereinbelow. The wafer 12 surface has particles 13a and 13b thereon and particle 14 in a void 21. The atmosphere 15 in the reactor is either liquid $CO_2$ or SCF $CO_2$.

Figure 1B:
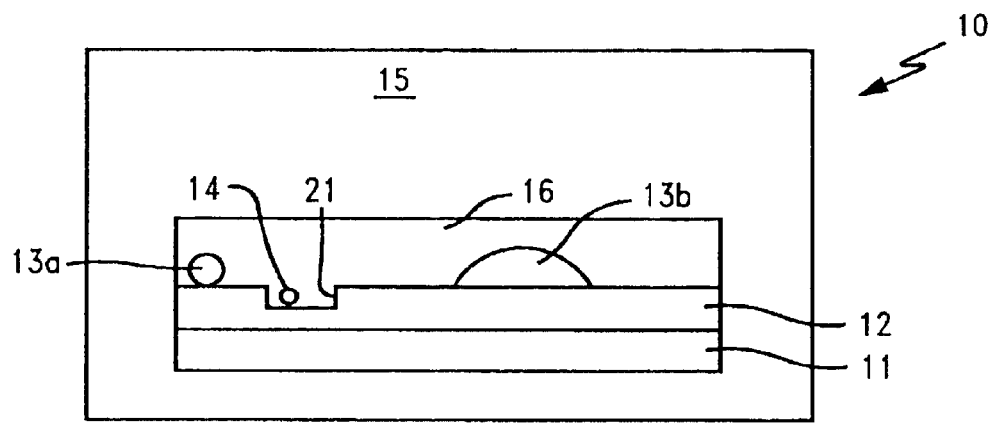

Referring now to FIG. 1B, the cooling/heat module 11 is activated to cool the wafer 12 so that liquid or SCF $CO_2$ 15 in contact with the wafer surface is converted to the solid state which envelopes the surface of the wafer.

Figure 1C:
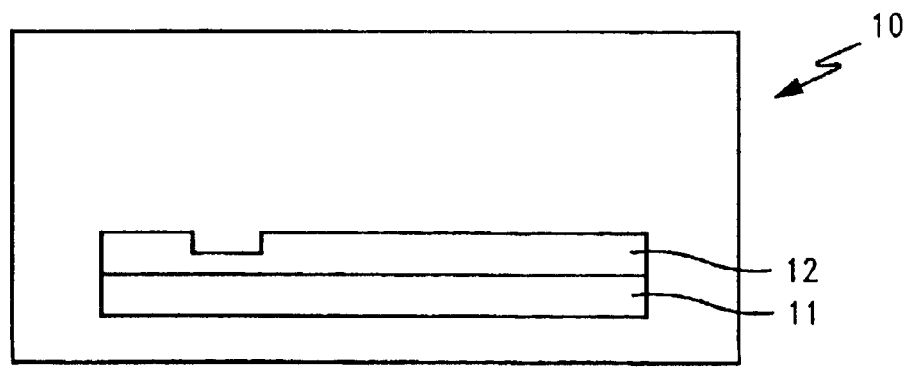

In FIG. 1C, the apparatus is shown having the $CO_2$ vaporized and flushed from the pressure vessel 10 removing the particles 13a, 13b and 14. The resulting wafer 12 is now clean.

In an important aspect of the invention, the cooling to solidify the $CO_2$ and the heating to liquefy or vaporize the $CO_2$ is repeated a plurality of times (cycled) to aid in dislodging the contaminants. After the desired number of cycles the $CO_2$ is vaporized and flushed from the pressure vessel.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, What is claimed is:

1. A method for removing solid and/or liquid residues from a semiconductor substrate comprising the steps of:

supplying a pressure vessel;

supplying in the vessel a semiconductor substrate having a surface containing residues to be removed therefrom;

supplying a material in the vessel at a pressure and temperature so that the material is a liquid or the material is above the critical pressure and temperature so that the material is a supercritical fluid;

lowering the temperature of the substrate surface so that the material contacting the surface of the substrate is converted to solid state on the substrate surface;

changing the temperature and/or pressure in the vessel so that the material in the vessel is converted to a liquid and/or gaseous state;

removing the material and residues from the vessel; and removing the semiconductor substrate from the vessel.

2. The method of claim 1 wherein the material is carbon dioxide.

3. The method of claim 2 wherein the carbon dioxide contains a surfactant.

4. The method of claim 2 wherein the carbon dioxide is used in admixture with one or more of Ar, $NH_3$, $CH_4$, $CHF_3$, $C_2H_6$, n-$C_3H_8$, $H_2O$ and $N_2O$.

5. The method of claim 2 wherein the carbon dioxide is in the supercritical state.

6. The method of claim 1 wherein the steps of lowering the temperature of the substrate surface to convert the material to the solid state and changing the temperature and/or pressure to convert the material to the liquid and/or gaseous state is repeated one or more times.

7. An apparatus for removing solid and/or liquid residues from a semiconductor substrate comprising:

a pressure vessel adapted to hold therein a semiconductor wafer substrate having a surface;

means for supplying a material to the pressure vessel;

means for adjusting temperature and pressure in the pressure vessel so that the material is converted to a liquid state or supercritical state;

means for lowering the temperature of the substrate surface so that material in contact with the substrate surface is converted to a solid state on the semiconductor substrate surface;

means for adjusting the temperature and pressure in the pressure vessel so that the material is converted to the liquid and/or gaseous state;

means for removing the material from the pressure vessel;

wherein when the material is converted to a solid state on the substrate surface and then converted to the liquid and/or gaseous state, residues on the semiconductor substrate surface are removed.

8. The apparatus of claim 7 wherein the material is carbon dioxide.

9. The apparatus of claim 8 wherein the carbon dioxide is in the supercritical state.

10. The apparatus of claim 9 wherein means are provided for repeating one or more times lowering of the temperature to convert the carbon dioxide in contact with the substrate surface to the solid state and for adjusting the temperature and pressure to convert the carbon dioxide in the pressure vessel to the liquid and/or gaseous state.

* * * * *